United States Patent
Amaratunga et al.

[11] Patent Number: 5,925,900
[45] Date of Patent: Jul. 20, 1999

[54] EMITTER-SWITCHED THYRISTOR HAVING A FLOATING OHMIC CONTACT

[75] Inventors: Gehan Anil Joseph Amaratunga; Wei Chen, both of Cambridge, United Kingdom; Naoki Kumagai, Nagano, Japan

[73] Assignee: Fuji Electric Co., Ltd., Tokyo, Japan

[21] Appl. No.: 08/765,787

[22] PCT Filed: May 11, 1995

[86] PCT No.: PCT/GB95/01072

§ 371 Date: Apr. 8, 1997

§ 102(e) Date: Apr. 8, 1997

[87] PCT Pub. No.: WO96/36076

PCT Pub. Date: Nov. 14, 1996

[51] Int. Cl.[6] .................... H01L 29/74; H01L 31/111
[52] U.S. Cl. .................. 257/147; 257/153; 257/162; 257/163
[58] Field of Search .................. 257/141, 147, 257/152, 153, 162, 163, 139, 140, 144

[56] References Cited

U.S. PATENT DOCUMENTS 5,293,054  3/1994  Shekar et al. .................. 257/152
5,294,816  3/1994  Shekar et al. .................. 257/163
5,349,212  9/1994  Seki .................. 257/133

OTHER PUBLICATIONS

"A CMOS Compatible Lateral Emitter Switched Thyristor with Enhanced Turn–on Capability"; Nov. 1994; IEEE, Electron Device Letters vol. 15, No. 11; Chen et al.

"Lateral Junction–Isolated Emitter Switched Thyristor" by Baliga et al. (IEEE Electron Device Letters, vol. 13, No. 12, Dec. 1992, pp. 615–617.

"The MOS–Gated Emitter Switched Thyristor" by B. J. Baliga (Proceedings of 1990 International Symposium on Power Semiconductor Devices & IC's, Tokyo, pp. 117–121).

*Primary Examiner*—Wael Fahmy
*Attorney, Agent, or Firm*—Baker & Botts, L.L.P.

[57] ABSTRACT

The operating characteristics of emitter-switched thyristors (1) are improved by the addition of a floating ohmic contact (14) over adjacent regions of n+ and p+ type (15,16). In a lateral device, the floating ohmic contact (14) and the adjacent regions of n+ and p+ type (15,16) are provided between the anode region (4) and the cathode region (8,9, 10). The device has enhanced turn-on characteristics with a high breakdown voltage and high current density capabilities.

19 Claims, 10 Drawing Sheets

EMITTER-SWITCHED THYRISTOR HAVING A FLOATING OHMIC CONTACT

FIELD OF THE INVENTION

The present invention relates to a semiconductor device.

BACKGROUND OF THE INVENTION

In power integrated circuits, many devices having a high breakdown voltage are known. For applications such as integrated power supplies, small motor control, and electronic lamp ballasts, where high voltage and high current are required, the current carrying capability of the device is also important. The on-state specific resistance of the power device therefore needs to be low to reduce power loss. This is very important in an IC environment where minimum area and power dissipation are essential.

Figure 1:
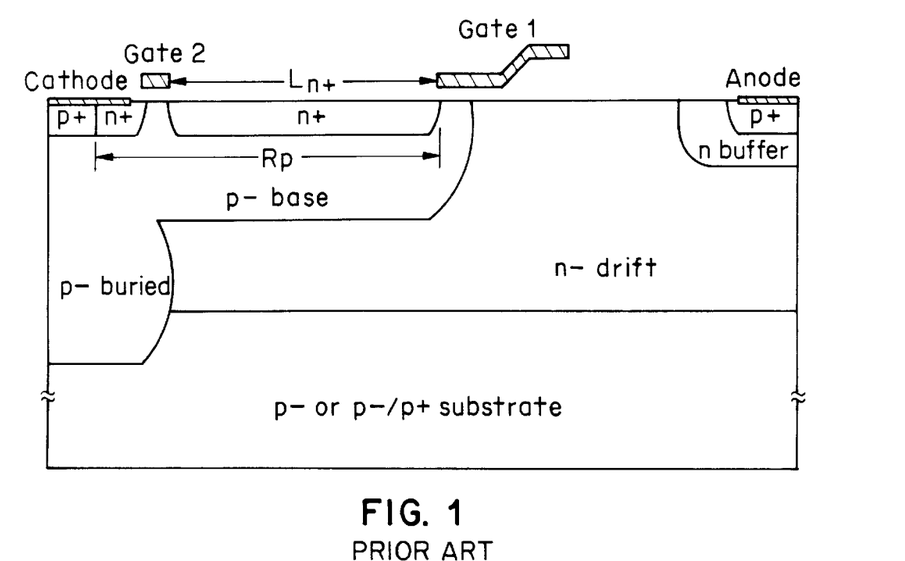
FIG. 1 is a cross-sectional view of a conventional LEST.

One known device is the emitter switched thyristor and particularly the lateral emitter switched thyristor (LEST). Reference is made to the paper by B J Baliga and Y S Huang, entitled "Lateral Junction-isolated Emitter Switched Thyristor," IEEE Electron Device Letters vol. 13, p. 615, 1992. The thyristor current for this device can be controlled by using a MOS gate. An example of a conventional LEST structure is shown in FIG. 1. In the conventional LEST device of FIG. 1, triggering of the main thyristor is difficult. A very long n+ floating emitter is necessary to ensure that the device operates in thyristor conduction mode, which leads to excessive area consumption by the device.

SUMMARY OF THE INVENTION

According to a first aspect of the present invention, there is provided a lateral emitter-switched thyristor, the thyristor comprising:

a first electrode region of a first conduction type formed in the surface of a drift region of a second conduction type;

a base region of a first conduction type formed in the drift region;

an emitter region of the second conduction type formed in the surface of the base region;

a second electrode region consisting of adjacent regions of the first and second conduction types with the second electrode region of the second conduction type being separated from the emitter region by a portion of the base region;

adjacent regions of the first and second conduction types formed in the surface of the base region between the first electrode region and the emitter region, the region of the first conduction type being on the side next to the emitter region;

a floating ohmic contact connecting said adjacent regions of the first and second conduction types formed in the surface of the base region;

a first gate at the surface of the device, the first gate commencing at the region of the second conductivity type under the floating ohmic contact and extending over the junction between the drift region and the base region; and, a second gate extending over said portion of the base region between the emitter region and the second electrode region of the second conduction type.

The floating ohmic contact may be immediately adjacent the emitter region or may be spaced from the emitter region.

According to a second aspect of the present invention, there is provided a lateral emitter-switched thyristor, the thyristor comprising:

a first electrode region of a first conduction type formed in the surface of a drift region of a second conduction type;

a base region of a first conduction type formed in the drift region;

a second electrode region of the first conduction type formed in the surface of the drift region;

adjacent regions of the first and second conduction types formed in the surface of the base region between the first electrode region and the second electrode region, the region of the first conduction type being on the side next to the second electrode region;

a floating ohmic contact connecting said adjacent regions of the first and second conduction types formed in the surface of the base region;

a first gate at the surface of the device, the first gate commencing at the region of the second conductivity type under the floating ohmic contact and extending over the junction between the drift region and the base region; and, a second gate at the surface of the device and between the second electrode region and the region of the first conduction type under the floating ohmic contact, a region of the second conduction type being under the second gate.

Said region of the second conduction type under the second gate may be formed by a portion of the drift region, or a buffer region in the drift region, or by a buffer region within the base region, for example.

In either aspect, the thyristor may be formed on a substrate of the first conduction type.

A further gate may be provided to control injection of minority carriers from the first electrode region as described in more detail below.

According to a third aspect of the present invention, there is provided a vertical emitter-switched thyristor, the thyristor comprising:

a first electrode region of a first conduction type formed in one surface of a drift region of a second conduction type;

a well region of the first conduction type formed in the opposite surface of the drift region;

a second electrode region consisting of adjacent regions of the first and second conduction types formed in the surface of said well region;

an emitter region of the second conduction type formed in the surface of the well region with the second electrode region of the second conduction type being separated from the emitter region by a portion of the well region;

adjacent regions of the first and second conduction types formed in the surface of the well region, the emitter region being between said adjacent regions of the first and second conduction types and the second electrode region, the region of the first conduction type being on the side next to the emitter region;

a floating ohmic contact connecting said adjacent regions of the first and second conduction types formed in the surface of the well region;

a first gate at said opposite surface of the drift region, the first gate commencing at the region of the second conduction type under the floating ohmic contact and extending over a portion of the well region between the floating ohmic contact and the drift region; and, a second gate at said opposite surface of the drift region and extending over the portion of the well region between the second electrode region and the emitter region.

The floating ohmic contact may be immediately adjacent the emitter region or may be spaced from the emitter region.

There may be a sink region of the first conduction type under the second electrode region.

According to a fourth aspect of the present invention, there is provided a vertical emitter-switched thyristor, the thyristor comprising:

a first electrode region of a first conduction type formed in one surface of a drift region of a second conduction type;

a well region of a first conduction type formed in the opposite surface of the drift region;

a second electrode region of the first conduction type formed in the surface of said well region of the first conduction type;

adjacent regions of the first and second conduction types formed in the surface of the well region of the first conduction type and spaced from the second electrode region with the region of the first conduction type being on the side nearest the second electrode region;

a floating ohmic contact connecting said adjacent regions of the first and second conduction types formed in the surface of the well region of the first conduction type;

a well region of the second conduction type in the surface of the well region of the first conduction type between the second electrode region and the adjacent regions of the first and second conduction types under the floating ohmic contact;

a first gate at said opposite surface of the drift region, the first gate commencing at the region of the second conduction type under the floating ohmic contact and extending over a portion of the well region of the first conduction type between the floating ohmic contact and the drift region; and, a second gate at said opposite surface of the drift region and extending over said well region of the second conduction type between the second electrode region and the region of the first conduction type under the floating ohmic contact.

In the third and fourth aspects, there may be a buffer region of the second conduction type over the first electrode region.

The present invention provides a device with enhanced turn-on characteristics with a high breakdown voltage and high current density capabilities.

In this specification, the term "gate" shall be taken to mean a gate of a metal-insulator-semiconductor type.

BRIEF DESCRIPTION OF THE DRAWING

Examples of the present invention will now be described with reference to the accompanying drawings, in which.

DETAILED DESCRIPTION OF PREFERRED EMBODIMENTS

Figure 2:
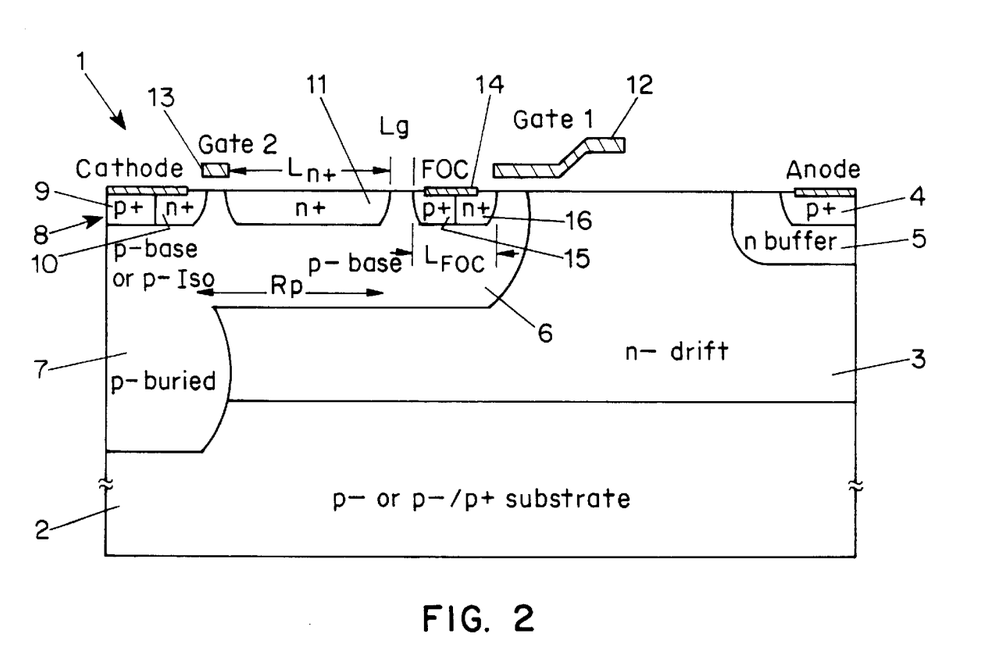
FIG. 2 is a cross-sectional view of a first example of a device according to the present invention.

The first example will be described with reference to FIG. 2. A device 1 has a p substrate, or a p– substrate, or a p– layer on a p+ substrate 2, on which is formed an n– drift region 3. On one side of the drift region 3 and at its surface is formed a p+ anode region 4. An n buffer region 5 is formed around the anode region 4 to prevent punch-through.

A p base region 6 is formed adjacent the drift region 3 and is continuous with a p buried region 7 which extends from the drift region 3 into the substrate 2. A cathode region 8 is formed in the surface of the base region 6. The cathode region 8 consists of a p+ region 9 and an adjacent n+ region 10.

A floating n+ emitter region 11 is formed in the surface of the base region 6 between the cathode 8 and anode 4.

A first gate 12 extends over the boundary between the drift region 3 and the base 6. A second gate 13 is situated over the base 6 between the emitter 11 and the cathode 8.

A floating ohmic contact (FOC) 14 is positioned between the drift region 3 and the floating emitter 11. Adjacent p+ and n+ regions 15,16 are embedded in the p base region 6 to the right side of the n+ floating emitter 11. These p+ and n+ regions 15,16 are electrically connected by the floating ohmic contact (FOC) 14. The first gate 12 commences at the n+ region 16 under the floating ohmic contact 14.

The off-state characteristics of the device 1 are the same as for the conventional LEST and reference is made to the paper by Baliga and Huang mentioned above for a detailed description of such. Briefly, when the bias voltage applied to the two NMOS gates 12,13 is zero, the device 1 supports voltage by depletion of the n– drift region 3 and the p substrate 2.

The turn-on mechanism is different, however. When a positive voltage above a threshold voltage is applied to the two NMOS gates 12,13 simultaneously, inversion channels are formed under the two gates 12,13. The inversion layer formed under the first gate 12 connects the n– drift region 3 to the p+ cathode 9 via the FOC 14. Before triggering of the main thyristor formed by the p+ anode 4, the n-drift region 3, the p base region 6, and the n+ emitter region 11, the device behaves like a lateral insulated gate bipolar transistor (LIGBT) except that an additional resistance $R_p$ due to the p base region 6 is placed in series. The FOC 14 acts as an electron-to-hole current converter. Electrons coming from it flow through the channel of the first gate 12 to the n– drift region 3. This MOS current $I_{MOS1}$ serves as the base drive current to the lateral pnp transistor which consists of the p+ anode 4, the n– drift region 3, and the p base 6. The $I_{MOS1}$ electron current is converted by the FOC 14 into a hole current $I_p$ by the requirement for current continuity across the shorted p+ and n+ regions 15,16 under the FOC 14. The hole current $I_p$ in turn flows laterally into the p base 6 to the p+ cathode region 8. In addition, part of the holes which are injected from the anode 4 will reach the p base 6 and form a collector current $I_c$. At this stage, the emitter junction of the main thyristor is not turned on and no current flows through the second NMOS channel under the second gate 13. Accordingly, the n+ floating emitter 11 is at the same potential as the cathode region 8. Thus, the voltage across the junction between the floating n+ emitter 11 and the p base 6 is given by:

$$V_{be} = R_p \cdot (I_{MOS1} + I_C) \approx R_p \cdot I_{anode}$$

since current flow is almost entirely through the p base 6. In contrast, in a conventional LEST as shown in FIG. 1, the corresponding voltage is less for the same anode current level and is given by:

$$V_{be} = R_p \cdot I_c - R_{MOS2} \cdot I_{MOS2} \approx [\alpha \cdot R_p - (1-\alpha) \cdot R_{MOS2}] \cdot I_{anode}$$

Here, $I_{MOS2}=I_{MOS1}$ serves as the base drive current for the lateral pnp transistor. $R_{MOS2}$ is the channel resistance of the second gate 13. $I_{anode}$ is the anode current, and α is the current transfer ratio of the lateral pnp transistor.

The main thyristor will be triggered on when Vbe is sufficiently high to forward bias the junction between the floating n+ emitter 11 and the p base 6. The equations above suggest that the main thyristor in the device 1 of the present invention can be triggered on at a lower anode current level. In other words, the length $L_{n+}$ of the floating n+ emitter 11 can be considerably shorter than in the conventional LEST shown in FIG. 1. If the reduction in the length $L_{n+}$ is greater than the length taken up by the FOC 14, the device 1 is more area efficient. The gap $L_g$ between the n+ emitter 11 and the FOC 14 can be reduced to zero and the length $L_{FOC}$ of the FOC itself can be reduced to a minimum allowed by the process design rule; for example, the length $L_{FOC}$ may be reduced to 9 μm for a 3 μm design rule.

After triggering on of the main thyristor, the device works in the same way as the conventional LEST shown in FIG. 1 and described in the paper mentioned above. Current saturation will occur due to "pinch-off" of the channel under the second gate 13 which is in series with the main thyristor.

A numerical simulation has been carried out using a structure with $L_{n+}$ of 25 μm, $L_{FOC}$ of 10 μm, $L_g$ of zero, and a drift region length of 50 μm. Thyristor conduction starts from an anode current level of 15 A/cm². In contrast, in a simulation with a conventional LEST having the same dimensions except that the length of the n+ emitter 11 was equal to 35 μm (=$L_{n+}+L_g+L_{FOC}$), no thyristor conduction was observed until the anode current density reached 108 A/cm².

The device was fabricated using an HVIC process based on a standard 3 μm CMOS process after growing a 7 μm-thick, $1.5\times10^{15}$/cm$^{-3}$ n- epitaxial layer on a 150–200 Ω.cm p substrate. The gate oxide is 400 Å and gives a 0.7 V threshold voltage, making it suitable for on-chip digital CMOS control. The drift region length is 60 μm. The MOS channel lengths are 6 μm and 5 μm for the first and second gates 12,13 respectively. The n+ emitter length is 25 μm. $L_g$ and $L_{FOC}$ are 7 μm and 34 μm respectively; the design was conservative to ensure working devices and no attempt was made to optimise the parameters in this example. An off-state breakdown voltage of 320 V was measured. Diodes with the same drift length dimensions fabricated on the same chip had a similar breakdown voltage, confirming that the new device shows no degradation in off-state performance. A kink in the output characteristics at a current of 6 mA (12.5 A/cm², based on the active area of the entire cell pitch) indicates the transition from LIGBT to thyristor mode. The on-state voltage at 100 A/cm² current density is about 3.5 V with $V_g$=5 V, which is very good as $L_g$ and $L_{FOC}$ were not optimised in the experimental device. Anode current saturation after the triggering on of the main thyristor is also evident, confirming that the enhanced LEST structure retains a wide safe operating area characteristic, one of the main attractions of the LEST for power IC applications. At 5 V gate voltage, current begins to saturate to about 100 mA (200 A.cm²) indicating a maximum MOS controllable current in excess of 200 A.cm² without parasitic latch-up.

The device 1 has an enhanced turn-on capability without leading to deterioration in other attractive LEST characteristics. Thyristor turn-on, at a current density of 12.5 A/cm$^{-2}$ with a maximum 5 V MOS controllable current density in excess of 200 A/cm², is demonstrated.

Figure 3:
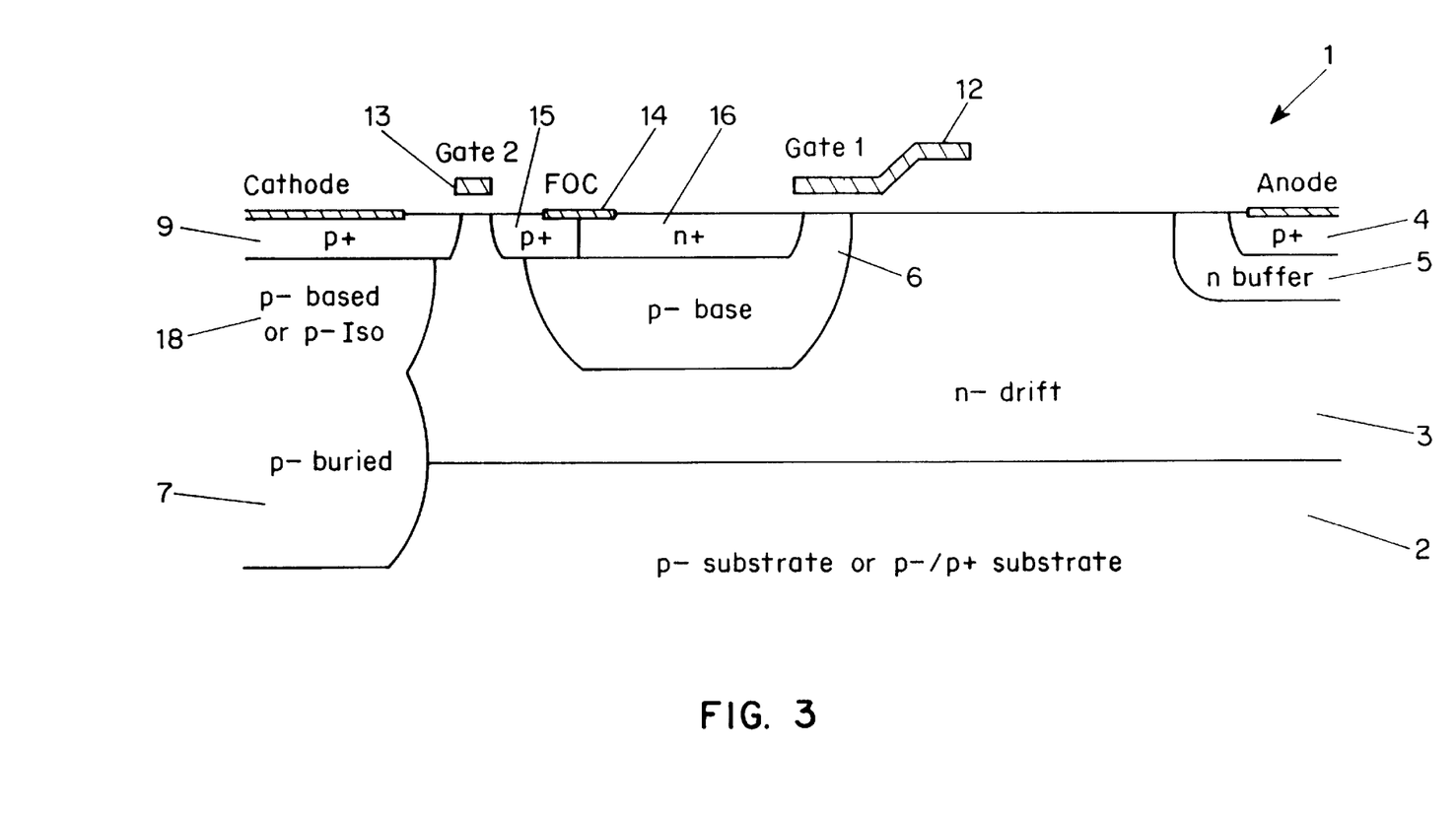
FIG. 3 is a cross-sectional view of a second example of a device according to the present invention.

In the example shown in FIG. 3, a device 1 has a p substrate, or a p– substrate, or a p– layer on a p+ substrate 2, on which is formed an n– drift region 3. On one side of the drift region 3 and at its surface is formed a p+ anode region 4. An n buffer region 5 is formed around the anode region 4 to prevent punch-through.

A p base region 6 is forced in the drift region 3. A p base or p iso region 18 is continuous with a p buried region 7 and both are separated from the p base 6 by a portion of the n– drift region 3. A p+ cathode region 9 is formed in the surface of the cathode p base region 18.

A first gate 12 extends over the boundary between the drift region 3 and the base 6. A second gate 13 is situated over the n– drift region 3 adjacent the p+ cathode region 9.

A floating ohmic contact (FOC) 14 is positioned between the two gates 12,13. The FOC 14 is formed on adjacent p+ and n+ regions 15,16 with the n+ region 16 being formed in the surface of the p base region 6. In the example shown, the p+ region 15 extends between the p base region 6 and the portion of the n– drift region 3 under the second gate 13 as shown in FIG. 3, though the p+ region 15 need not extend outside the p base region 6. The first gate 12 commences at the n+ region 16 under the floating ohmic contact 14.

Figure 4:
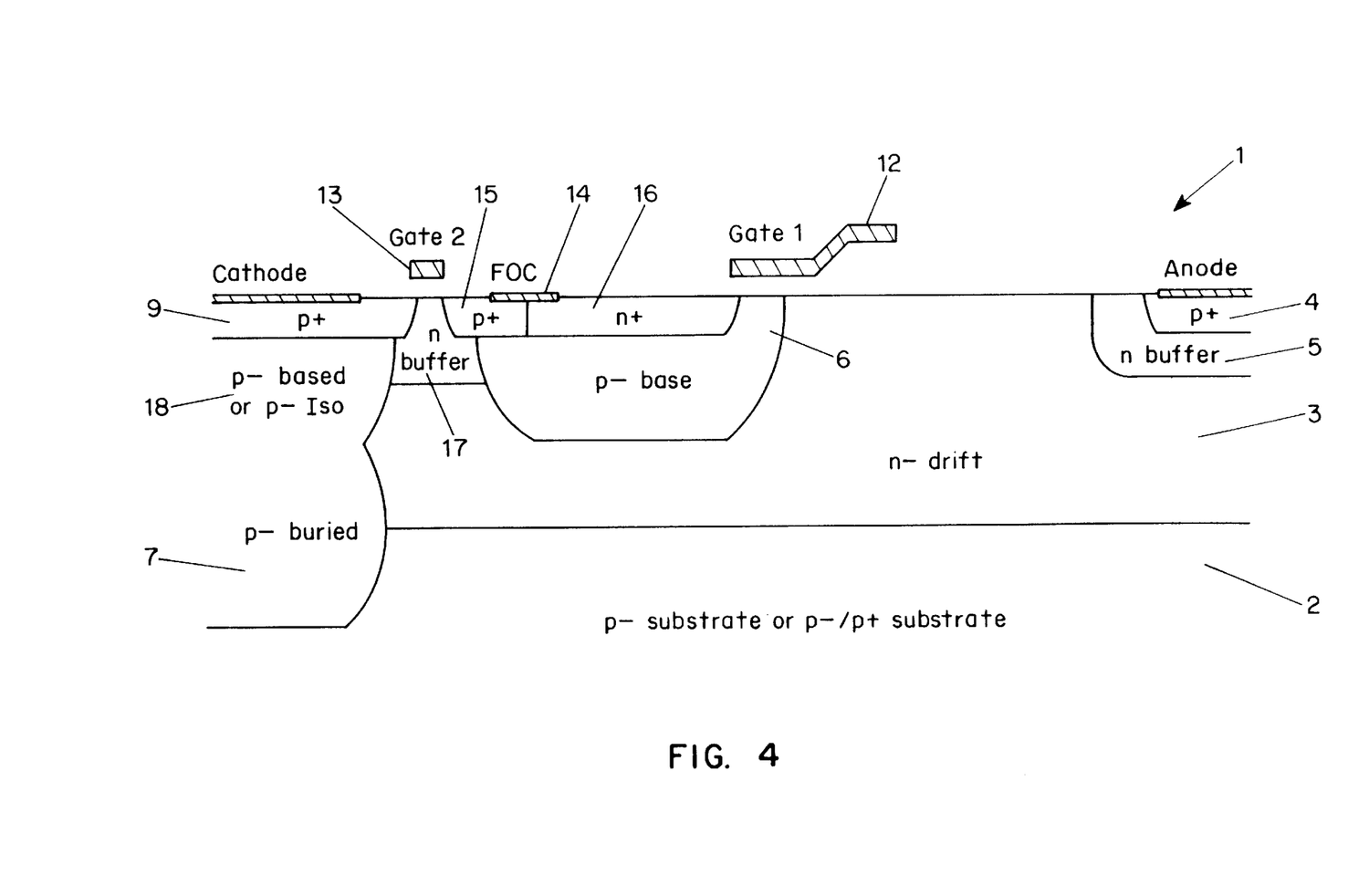
FIG. 4 is a cross-sectional view of a third example of a device according to the present invention.

In the third example shown in FIG. 4, the structure is very similar to that of the second example shown in FIG. 3. The main difference is that, in the third example, an n buffer region 17 under the second gate 13 is implanted and formed in the n– drift region 3 between the p base regions 6,18. The n buffer region 17 is preferably formed before the p base regions 6,18 are formed.

Figure 5:
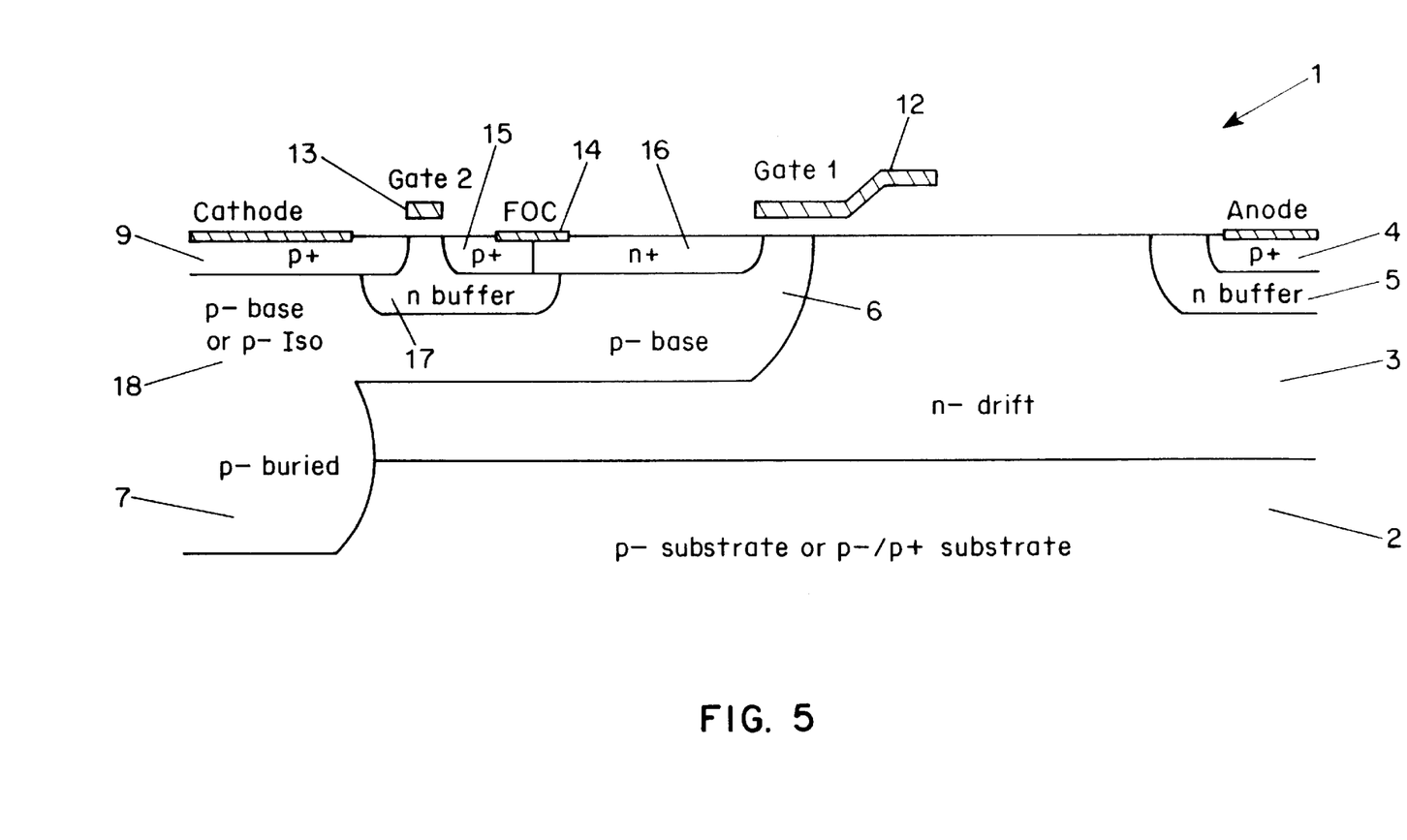
FIG. 5 is a cross-sectional view of a fourth example of a device according to the present invention.

In the fourth example shown in FIG. 5, the structure is very similar to that of the second example shown in FIG. 3. The main difference is that, in the fourth example, an n buffer region 17 under the second gate 13 is implanted and formed in the p well consisting of the two p base regions 6,18 which, in this example, are continuous. The n buffer region 17 is preferably formed after the p base regions 6,18 have been formed.

Operation of each of the devices 1 shown in FIGS. 3 to 5 is very similar. The off-state characteristics of the devices 1 shown in FIGS. 3 to 5 are the same as for the conventional LEST and reference is made to the paper by Baliga and Huang mentioned above for a detailed description of such. Briefly, when the bias voltage applied to the two gates 12,13 is zero, the device 1 supports voltage by depletion of the n– drift region 3 and the p substrate 2.

To turn on the devices 1 shown in FIGS. 3 to 5, a positive voltage is applied to the first gate 12 and a negative voltage is applied to the second gate 13 to create respective inversion channels under the gates 12,13, it being understood that the cathode p+ region 9, the n– drift region 3 or n buffer region 17 under the second gate 13, and the p+ region 15 under the FOC 14 form a PMOS transistor in series with the main thyristor formed by the p+ anode 4, the n– drift region 3, the p base 6 and the n+ region 16 under the FOC 14. The presence of this PMOS transistor means that the parasitic npnp thyristor, which forms due to the n+ region at the cathode of the conventional LEST shown in FIG. 1, is removed; this parasitic thyristor is described in the paper by Baliga and Huang mentioned above. A much higher MOS controllable current density is therefore possible with the devices of FIGS. 3 to 5.

To turn off the devices of FIGS. 3 to 5, the second gate 13 is switched off to remove the PMOS inversion layer under the second gate 13 and the thyristor conduction path is quickly broken.

Figure 6:
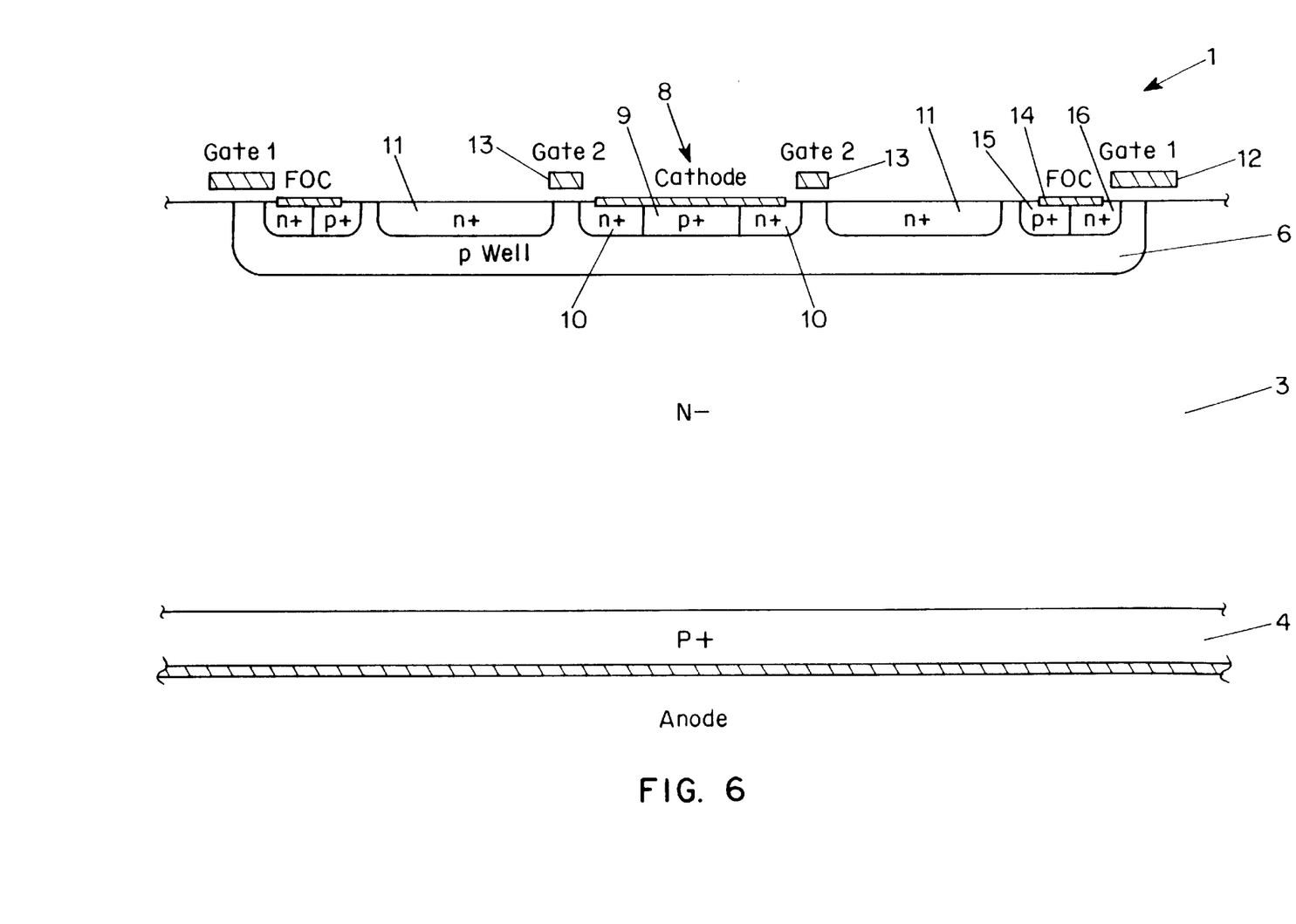
FIG. 6 is a cross-sectional view of a fifth example of a device according to the present invention.

A further example of a device 1 according to the present invention is shown in FIG. 6, this example being a vertical device and having circular symmetry when viewed from above. The device 1 has an n− drift region 3 on one side of which is formed a p+ anode region 4 to which is fixed the anode electrode. A p well 6 is formed in the surface on the other side of the n− drift region 3.

In the surface of the p well 6 is formed a cathode region 8 consisting of a central p+ cathode region 9 surrounded by an annular n+ cathode region 10, to which is fixed a cathode electrode.

Surrounding the cathode region 8, and spaced therefrom, is an n+ floating emitter region 11. Surrounding the floating emitter region 11, and spaced therefrom, is a floating ohmic contact (FOC) 14 which is fixed to the surface over adjacent regions of p+ type 15 and n+ type 16 formed in the surface of the p well 6; the n+ region 16 under the FOC 14 is radially outwards of the p+ region 15 under the FOC 14 and stops short of the boundary between the p well 6 and the n− drift region 3 at the surface of the device.

A first gate 12 is fixed over the surface of the p well 6 above the portion of the p well 6 which extends to the surface of the device 1 next to the n+ region 16 under the FOC 14 and extends over the boundary between the p well 6 and the n− drift region 3 at the surface of the device. A second gate 13 is fixed over the surface of the p well 6 above the space between the cathode region 8 and the floating emitter region 11.

Operation of the device shown in FIG. 6 is as follows. In the off-state, when the bias voltage applied to the two NMOS gates 12,13 is zero, the device 1 supports voltage by depletion of the n− drift region 3.

For the on-state, when a positive voltage above a threshold voltage is applied to the two NMOS gates 12,13 simultaneously, inversion channels are formed under the two gates 12,13. The inversion layer formed under the first gate 12 connects the n− drift region 3 and the n+ region 16 under the FOC 14. Before triggering of the main thyristor formed by the p+ anode 4, the n-drift region 3, the p well region 6, and the n+ emitter region 11, the device behaves like an insulated gate bipolar transistor (IGBT) except that an additional resistance $R_p$ due to the p well region 6 is placed in series. The FOC 14 acts as an electron-to-hole current converter. Electrons coming from it flow through the channel of the first gate 12 to the n− drift region 3. This MOS current $I_{MOS1}$ serves as the base drive current to the pnp transistor which consists of the p+ anode 4, the n− drift region 3, and the p well 6. The $I_{MOS1}$ electron current is converted by the FOC 14 into a hole current $I_p$ by the requirement for current continuity across the shorted p+ and n+ regions 15,16 under the FOC 14. The hole current $I_p$ in turn flows laterally into the p well 6 to the p+ cathode region 8. In addition, part of the holes which are injected from the anode 4 will reach the p well 6 and form a collector current $I_c$. At this stage, the emitter junction of the main thyristor is not turned on and no current flows through the second NMOS channel under the second gate 13. Accordingly, the n+ floating emitter 11 is at the same potential as the cathode region 8. Thus, the voltage across the junction between the floating n+ emitter 11 and the p well 6 is given by:

$$V_{be} = R_p \cdot (I_{MOS1} + I_c) \approx R_p \cdot I_{anode}$$

since current flow is almost entirely through the p base 6. In contrast, in a conventional EST, the corresponding voltage is less for the same anode current level and is given by:

$$V_{be} = R_p \cdot I_c - R_{MOS2} \cdot I_{MOS2} \approx [\alpha \cdot R_p - (1-\alpha) \cdot R_{MOS2}] \cdot I_{anode}$$

Here, $I_{MOS2} = I_{MOS1}$ serves as the base drive current for the pnp transistor. $R_{MOS2}$ is the channel resistance of the second gate 13. $I_{anode}$ is the anode current, and $\alpha$ is the current transfer ratio of the pnp transistor.

The main thyristor will be triggered on when the anode voltage is increased so that Vbe is sufficiently high to forward bias the junction between the floating n+ emitter 11 and the p base 6, and the majority of current flow will be through the main thyristor. The equations above suggest that the main thyristor in the device 1 of the present invention can be triggered on at a lower anode current level.

After triggering on of the main thyristor, the device works in the same way as a conventional emitter-switched thyristor. Current saturation will occur due to "pinch-off" of the channel under the second gate 13 which is in series with the main thyristor.

Figure 7:
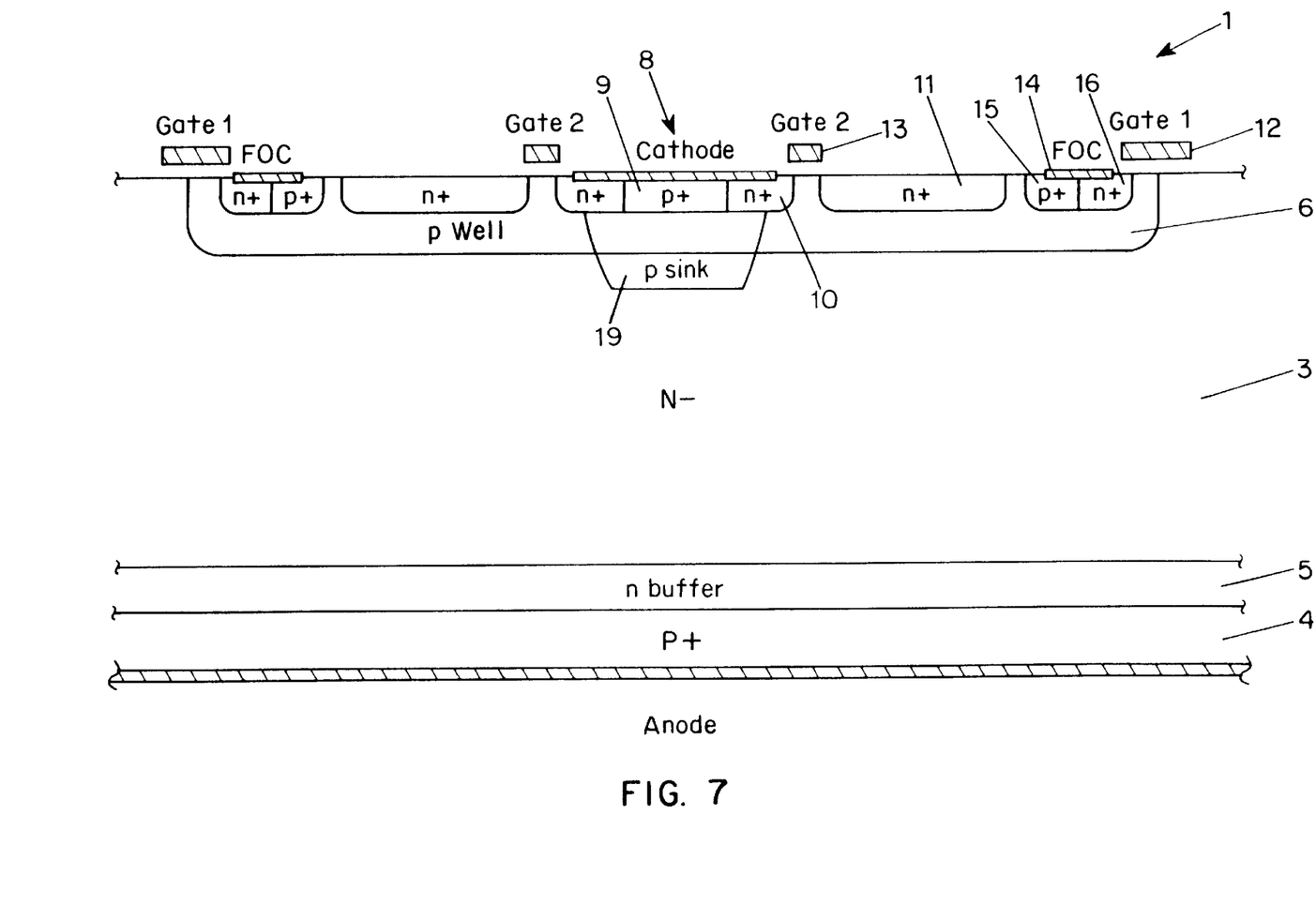
FIG. 7 is a cross-sectional view of a sixth example of a device according to the present invention; and, FIGS. 8–12 are a cross-sectional views of seventh –eleventh examples of a device according to the present invention.

A further example of a device 1 according to the present invention is shown in FIG. 7, this example being a vertical device and having circular symmetry when viewed from above. The vertical device 1 shown in FIG. 7 is similar to the device shown in FIG. 6 and thus only the differences will be further described.

In this example, an n buffer region 5 is formed over the anode p+ region 4 in order to prevent punch-through from occurring. This n buffer region 5 allows the n− drift region 3 to be relatively thinner for a specified voltage, leading to quicker switch off of the device.

Furthermore, a p sink 19 is formed under the cathode region 8. A parasitic thyristor consisting of the p+ anode region 4, the n− drift region 3, the p well 6, and the n+ region 10 of the cathode tends to reduce the performance of the device shown in FIG. 6, for example. The p sink 19 reduces the resistance in the p well region under the cathode region 8 and thus prevents this parasitic thyristor from being switched on except at very high current levels, usually above the current levels found in typical applications. The p sink 19 can extend below the p well 6 as shown in FIG. 7 or it may be shallower than the p well 6.

Figure 8:
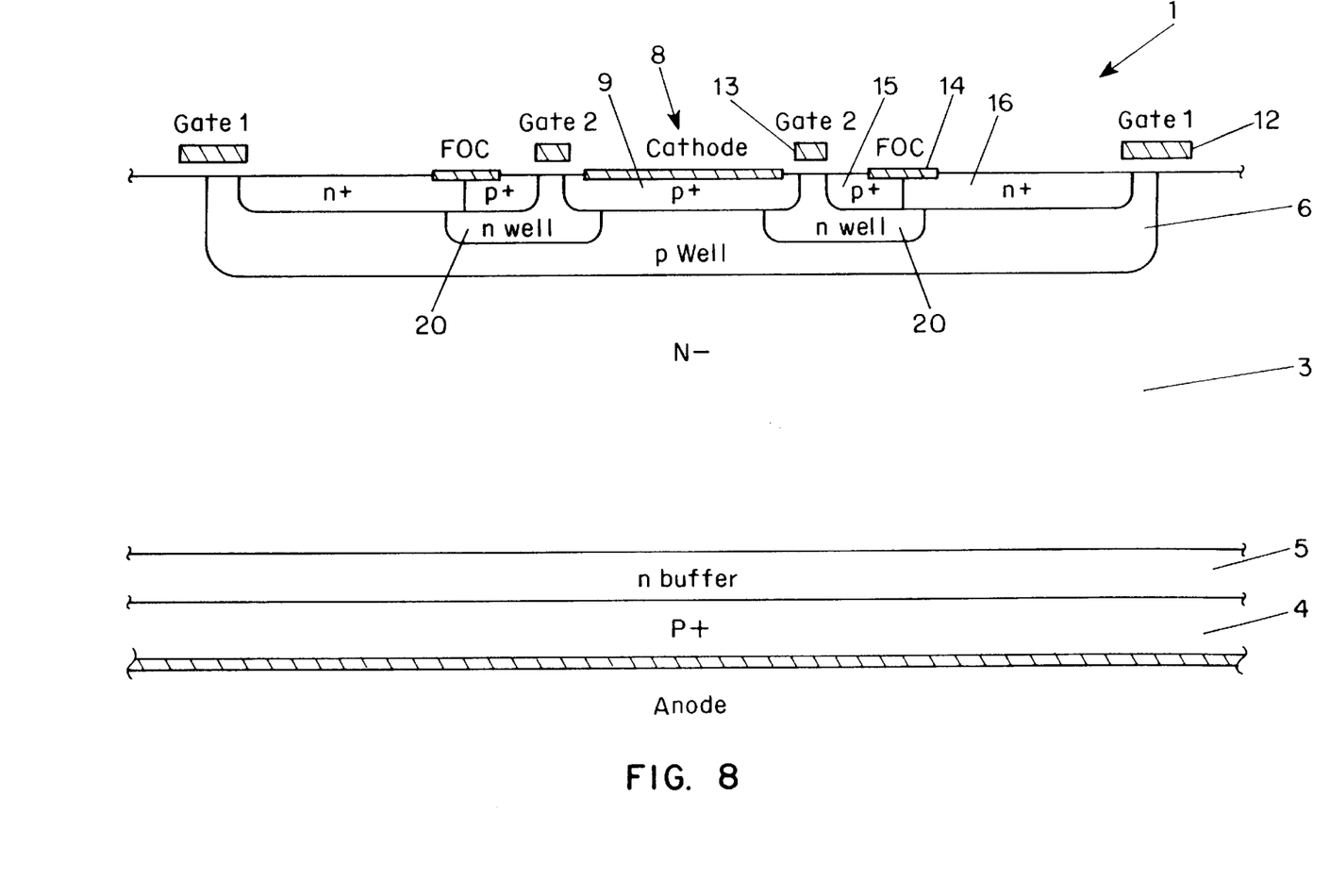

A further example of a device 1 according to the present invention is shown in FIG. 8, this example being a vertical device and having circular symmetry when viewed from above.

In this example, the device 1 has an n− drift region 3 on one side of which is formed a p+ anode region 4 to which is fixed the anode electrode. A p well 6 is formed in the surface on the other side of the n− drift region 3. In the surface of the p well 6 is formed a cathode region 8 consisting of a p+ cathode region 9 to which is fixed a cathode electrode.

Surrounding the cathode p+ region 9 and spaced therefrom, is a floating ohmic contact (FOC) 14 which is fixed to the surface over adjacent regions of p+ type 15 and n+ type 16 formed in the surface of the p well 6; the n+ region 16 under the FOC 14 is radially outwards of the p+ region 15 under the FOC 14 and stops short of the boundary between the p well 6 and the n− drift region 3 at the surface of the device 1.

A first gate 12 is fixed over the surface of the p well 6 above the portion of the p well 6 which extends to the surface of the device 1 next to the n+ region 16 under the FOC 14 and extends over the boundary between the p well 6 and the n− drift region 3 at the surface of the device.

A second gate 13 is fixed over the surface of the device 1 above the space between the cathode region 8 and the FOC 14. Under the second gate 13 is formed an n well 20. As shown, the n well 20 under the first gate 12 is deeper than the p+ cathode region 9 and the FOC n+ and p+ regions 15,16, but shallower than the p well 6. However, the n well 20 can alternatively be deeper than the p well 6.

In the example shown, an n buffer region 5 is formed over the anode p+ region 4 in order to prevent punch-through from occurring, as in the example shown in FIG. 7.

The operation of the device 1 of FIG. 8 is as follows. For the off-state, briefly, when the bias voltage applied to the two gates 12,13 is zero, the device 1 supports voltage by depletion of the n– drift region 3 and the p well 6.

To turn on the device 1 shown in FIG. 8, a positive voltage is applied to the first gate 12 and a negative voltage is applied to the second gate 13 to create respective inversion channels under the gates 12,13, it being understood that the cathode p+ region 9, the n well 20 under the second gate 13, and the p+ region 15 under the FOC 14 form a PMOS transistor in series with the main thyristor formed by the p+ anode 4, the n– drift region 3, the p base 6 and the n+ region 16 under the FOC 14. The presence of this PMOS transistor means that the parasitic npnp thyristor, which otherwise forms, is removed. A much higher MOS controllable current density is therefore possible.

To turn off the device of FIG. 8, the second gate 13 is switched off to remove the PMOS inversion layer under the second gate 13 and the thyristor conduction path is quickly broken.

A further MOS transistor using a third gate can be used to control minority carrier injection from the anode in each of the lateral devices described above with reference to FIGS. 2 to 5. This will be described with reference to FIGS. 9 to 12.

Figure 9:
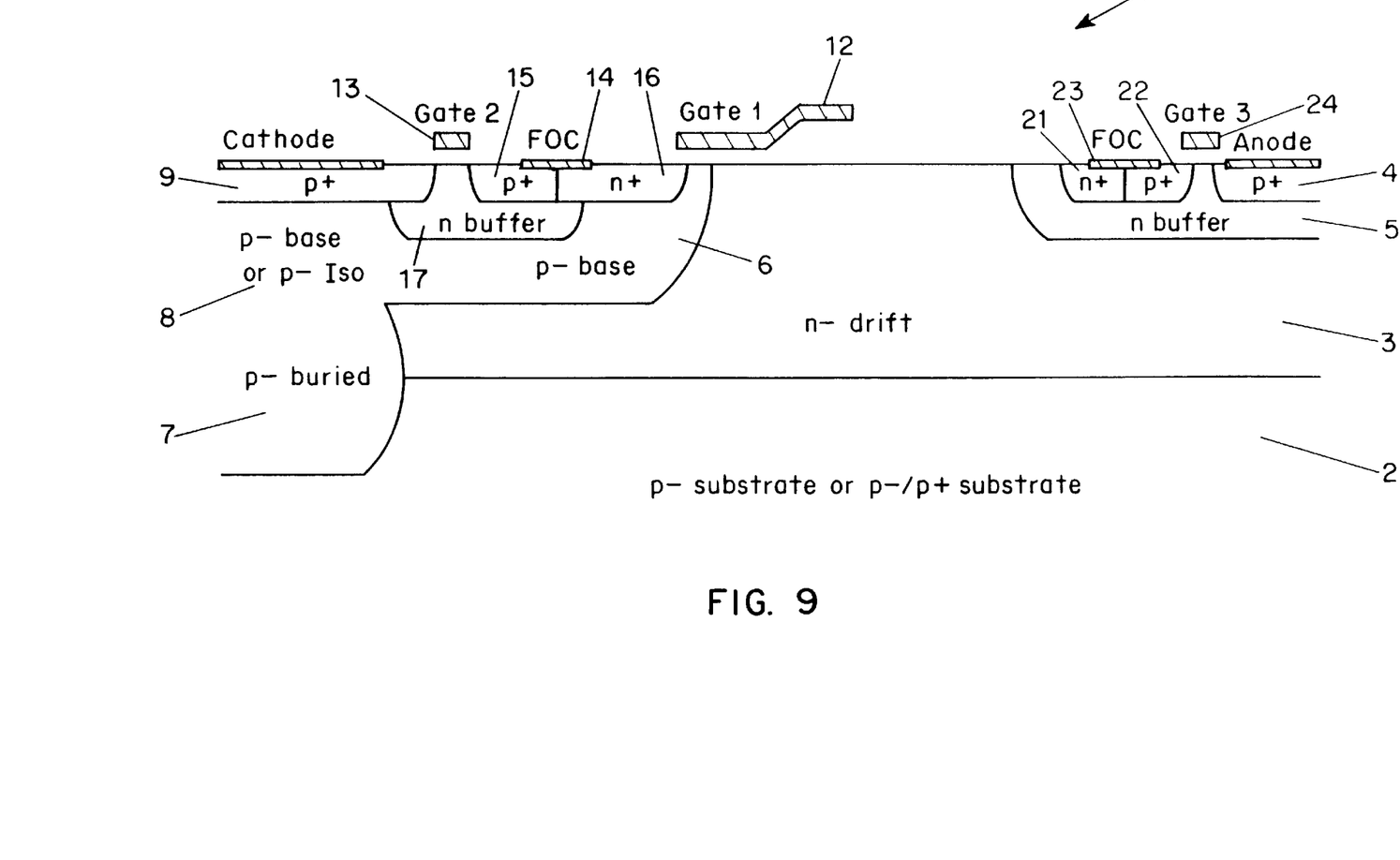

In FIG. 9, an example of the use of a PMOS to control the anode during switching off is shown as a modification of the device shown in FIG. 5. The anode region is modified by adding further adjacent n+ and p+ regions 21,22 in the surface of the drift region 3 close to but spaced from the p+ anode region 4. In the example shown, these further n+ and p+ regions 21,22 are formed in the n buffer region 5 formed around the anode region 4. A second floating ohmic contact 23 is fixed over the further n+ and p+ regions 21,22. A third gate 24 is fixed over the portion of the buffer region 5 between the anode region 4 and the further n+ and p+ regions 21,22.

During the on-state of the device 1, the third gate 24 is kept off. When the device 1 is turned off as described above, a voltage is applied to the third gate 24 to form an inversion channel under the third gate 24. This shorts the anode region 4 to the buffer 5 and hence the n– drift region 3 via the further FOC 23, thereby improving the turn-off performance by inhibiting the injection of minority carriers.

Figure 12:
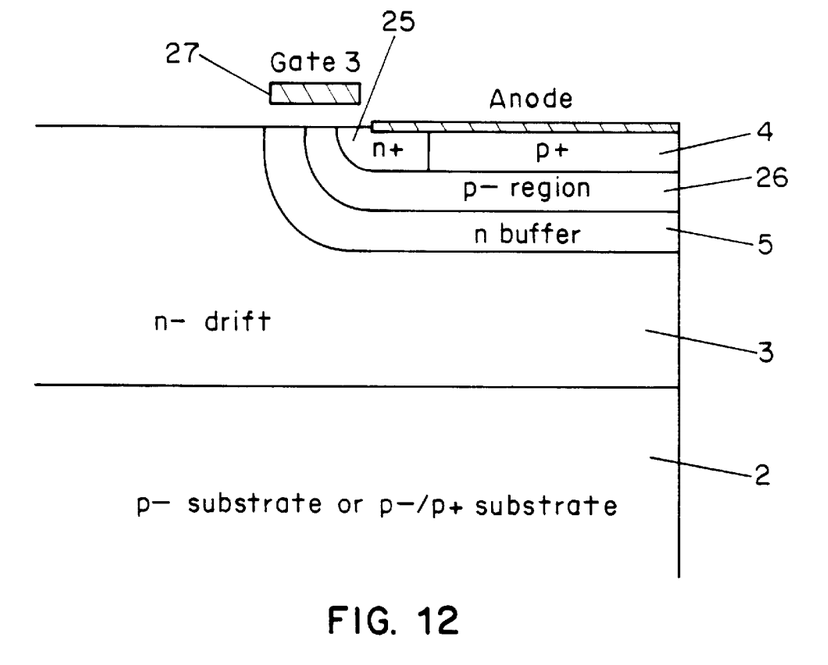

In FIG. 12, an example of the use of an NMOS to control the anode during switching off is shown; in FIG. 12, only the anode area is shown.

An n+ region 25 is provided next to the p+ anode region 4 and a p– region 26 is provided around the p+ and n+ anode regions 4,25. The n buffer region 5 is provided around the p– region 26. A third gate 27 is fixed over the portions of the n buffer region 5 and the p– region 26 which extend to the surface of the device 1 and also extends over the n+ anode region 25.

The operation of the use of an NMOS to control the anode during switching off is as described for the use of a PMOS with reference to FIG. 9 above. The p+ anode region 4 is again shorted to the n– drift region 3 during turn-off to speed up the switching off process.

Figure 10:
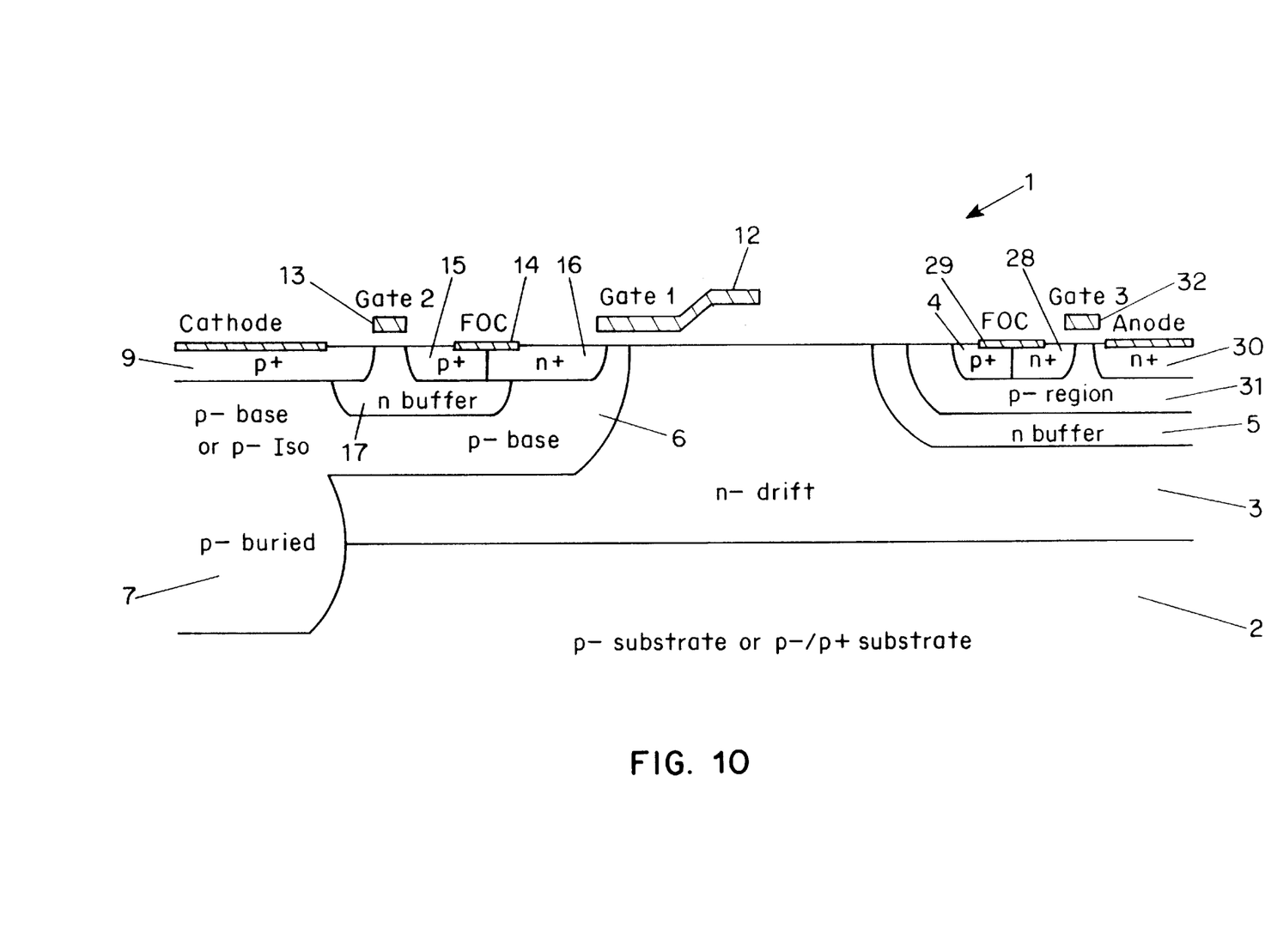

In FIG. 10, an example of the use of a PMOS to control the anode during switching off is shown as a modification of the device shown in FIG. 5. The anode region is modified by adding an n+ region 28 next to the p+ "anode" region 4 and fixing a further FOC 29 over the adjacent p+ "anode" region 4 and n+ region 28. The p+ anode region 4 under the further FOC 29 acts as the anode during operation of the device 1. An n+ region 30 is formed close to but spaced from the n+ region 28 under the FOC 29 and this provides the external anode connection. The p+ and n+ regions 4,28 under the further FOC 29 and the n+ region 30 of the anode area are formed in a p– region in the surface of the device, the p– region 31 itself being formed in the buffer region S. A third gate 32 is fixed over the portion of the p– region 31 which extends to the surface of the device 1 between the FOC p+ and n+ regions 4,28 and the n+ region 30 of the anode area.

When the device is on, the third gate 32 is kept on so that the NMOS transistor in the anode area is on, thereby allowing the p+ region 4 under the FOC 29 to act as the anode. When the voltage to the third gate 32 is switched off, the p+ "anode" under the further FOC 29 is disconnected from the n+ region 30 of the anode area. In this case, if the device is designed so that the n+ region 30 of the anode area, the p– region 31 and the n buffer region 5 punches through at a low voltage, faster turn-off will be achieved because the punch-through provides a bypass route for the electrons.

Figure 11:
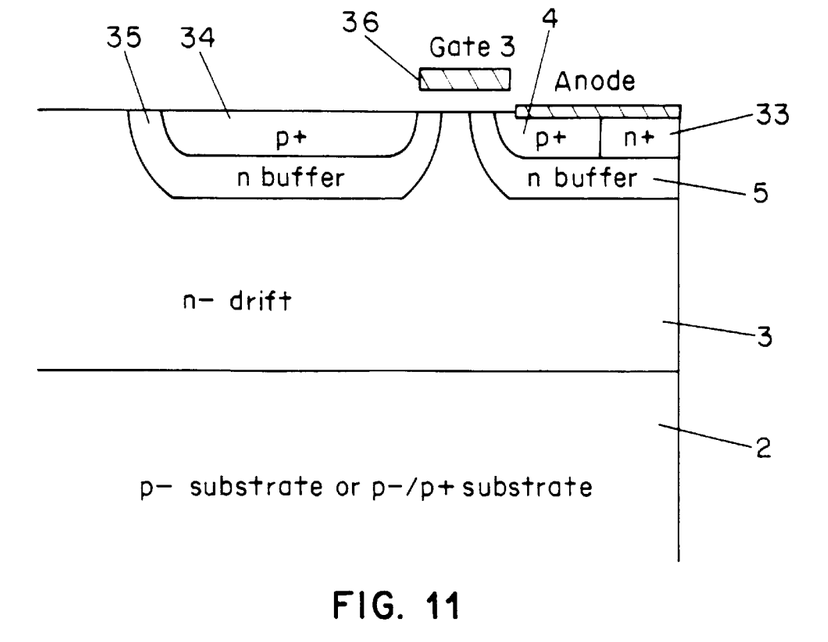

In FIG. 11, an example of the use of an PMOS to control the anode during switching off is shown; in FIG. 11, only the anode area is shown.

In this variant, an n+ region 33 is formed in the buffer region 5 around the p+ anode region 4, the n+ anode region 33 being in the surface of the device and adjacent the p+ anode region 4. A further p+ region 34 is formed in the surface of the drift region 3 close to but spaced from the p+ anode region 4. An n buffer region 35 may be provided around the further p+ region 34. A third gate 36 is fixed over the portion of the n– drift region which extends to the surface of the device between the p+ anode region 4 and the further p+ region 34.

Operation of this variant is as described above for the anode-switching example using an NMOS transistor with reference to FIG. 10. The third gate 36 is kept on when the device 1 is on and is switched off when the device is turned off to switch off connection between the p+ anode region 4 and the further p+ region 34.

For further control of the switching characteristics, the third gate adjacent the anode region 4 can be switched to a state which inhibits minority carrier injection from the anode region 4 for a specified time period before the first and second gates 12,13 are switched to turn off the device 1. For example, for the device 1 shown in FIG. 9, the third gate 24 can be switched on a specified time period before the first and second gates 12,13 are turned off the remove the inversion channels and turn off the device 1.

We claim:

1. A lateral emitter-switched thyristor (1) comprising:

a drift region (3) of a second conductivity type, having a drift-region surface;

a first electrode region (4) of a first conductivity type formed in the drift-region surface;

a base region (6) of the first conductivity type formed in the drift region (3), having a base-region surface which is contiguous with the drift-region surface, and forming a junction with the drift region (3);

an emitter region (11) of the second conductivity type formed in the base-region surface;

a second electrode region (8) formed in the base-region surface and consisting of adjacent first and second subregions (9, 10) of the first and second conductivity type, respectively, with the second subregion being separated from the emitter region (11) by a portion of the base region (6);

first and second adjacent regions (15, 16) of the first and second conductivity type, respectively, formed in the base-region surface between the first electrode region (4) and the emitter region (11), with the first adjacent region (15) being closer to the emitter region (11) than the second adjacent region (16);

a floating ohmic contact (14) connecting the first and second adjacent regions (15, 16);

a first gate contact (12) in part on the base-region surface and in part on the drift-region surface and extending from the second adjacent region (16) across the junction between the base region (6) and the drift region (3); and a second gate contact (13) on a portion of the base-region surface, between the emitter region (11) and the second subregion (10) of the second electrode region (8).

2. The thyristor according to claim 1, wherein the floating ohmic contact (14) is immediately adjacent to the emitter region (11).

3. The thyristor according to claim 1, wherein the floating ohmic contact (14) is spaced from the emitter region (11).

4. A lateral emitter-switched thyristor (1) comprising:

a drift region (3) of a second conductivity type, having a drift-region surface;

a first electrode region (4) of a first conductivity type formed in the drift-region surface;

a base region (6) of the first conductivity type formed in the drift region (3), having a base-region surface which is contiguous with the drift-region surface, and forming a junction with the drift region (3);

a second electrode region (9) of the first conductivity type formed in the drift-region surface;

first and second adjacent regions (15, 16) of the first and second conductivity type, respectively, formed in the base-region surface, between the first electrode region (4) and the second electrode region (9), the first adjacent region (15) being disposed between the second adjacent region (16) and the second electrode region (9);

a floating ohmic contact (14) connecting the first and second adjacent regions (15, 16);

a first gate contact (12) in part on the base-region surface and in part on the drift-region surface and extending from the second adjacent region (16) across the junction between the base region (6) and the drift region (3); and a second gate contact (13) on a device surface portion of the second conductivity type between the second electrode region (9) and the first adjacent region (15).

5. The thyristor according to claim 4, wherein the device surface portion of the second conductivity type between the second electrode region (9) and the first adjacent region (15) is formed by a portion of the drift region (3).

6. The thyristor according to claim 4, wherein the device surface portion of the second conductivity type between the second electrode region (9) and the first adjacent region (15) is formed by a buffer region (17) in the drift region (3).

7. The thyristor according to claim 4, wherein the device surface portion of the second conductivity type between the second electrode region (9) and the first adjacent region (15) is formed by a buffer region (17) in the base region (6).

8. The thyristor according to claim 1 or 4, formed on a substrate (2) of the second conductivity type.

9. The thyristor according to claim 1 or 4, further comprising a buffer region (5) of the second conductivity type under the first electrode region (4).

10. The thyristor according to claim 1 or 4, further comprising third and fourth adjacent regions (21, 22) of the second and first conductivity type, respectively, in a portion of the drift-region surface close to but spaced from the first electrode region (4), with the fourth adjacent region (22) being disposed between the first electrode region (4) and the third adjacent region (21), a floating ohmic contact being affixed to the third and fourth adjacent regions (21, 22), and there being a third gate (24) contacting the first electrode region (4) and the fourth adjacent region (22).

11. The thyristor according to claim 1 or 4, wherein the first electrode region (4) is formed in a region of the first conductivity type (26) which is formed in the drift region (3), and further comprising a region of the second conductivity type (25) in a surface portion of the device adjacent to the first electrode region (4), and a third gate (27) over the region of the second conductivity type (25) in the surface portion of the device adjacent to the first electrode region (4), extending over a portion of the region of the first conductivity type (26) in which the first electrode region (4) is formed.

12. The thyristor according to claim 1 or 4, wherein the first electrode region (4) is formed in a region of the first conductivity type (31) formed in the drift region (3), and further comprising a region of the second conductivity type (28) in a surface portion of the device adjacent to the first electrode region (4), there being a floating ohmic contact (29) over the first electrode region (4) and the region of the second conductivity type (28) in the surface portion of the device adjacent to the first electrode region (4), and further comprising a region of the second conductivity type (30) formed in the region of the first conductivity type (31) in which the first electrode region (4) is formed and being close to but spaced from the region of the second conductivity type (28) adjacent to the first electrode region (4), and a third gate (32) over a portion of the region of the first conductivity type (31) in which the first electrode region (4) is formed, between the region of the second conductivity type (28) under the floating ohmic contact (29) and the region of the second conductivity type (30) formed in the region of the first conductivity type (31) in which the first electrode region (4) is formed.

13. The thyristor according to claim 1 or 4, wherein a region of the second conductivity type (33) is formed in a surface portion of the device adjacent to the first electrode region (4), and further comprising a region of the first conductivity type (34) in a surface portion of the drift region (3) close to but spaced from the first electrode region (4), and a third gate (36) over a portion of the drift region between the first electrode region (4) and the region of the first conductivity type (34) in the surface portion of the drift region (3) close to but spaced from the first electrode region (4).

14. A vertical emitter-switched thyristor (1) comprising:

a drift region (3) of a second conductivity type, having mutually opposite first and second drift-region surfaces;

a first electrode region (4) of a first conductivity type formed in the first drift-region surface;

a well region (6) of the first conductivity type formed in the second drift-region surface and having a well-region surface;

a second electrode region (8) consisting of first and second adjacent regions (9, 10) of the first and second conductivity type, respectively, formed in a first portion of the well-region surface;

an emitter region (11) of the second conductivity type formed in a second portion of the well-region surface, with the second adjacent region being separated from the emitter region (11) by a portion of the well region (6);

third and fourth adjacent regions (15, 16) of the first and second conductivity type, respectively, formed in third and fourth portions of the well-region surface, the emitter region (11) being between the third adjacent region (15) and the second electrode region (8), and the third adjacent region (15) being next to the emitter region (11);

a floating ohmic contact (14) connecting the third (15) and fourth (16) adjacent regions;

a first gate contact (12) at the second drift-region surface, commencing at the fourth adjacent region (16) and extending over a portion of the well region (6) between the floating ohmic contact (14) and the drift region (3); and a second gate contact (13) at the second drift-region surface and extending over a portion of the well region (6) between the second electrode region (8) and the emitter region (11).

15. The thyristor according to claim 14, wherein the floating ohmic contact (14) is immediately adjacent to the emitter region (11).

16. The thyristor according to claim 14, wherein the floating ohmic contact (14) is spaced from the emitter region (11).

17. The thyristor according to claim 14, further comprising a sink region (19) of the first conductivity type under the second electrode region (8).

18. A vertical emitter-switched thyristor (1) comprising:

a drift region (3) of a second conductivity type, having mutually opposite first and second drift-region surfaces;

a first electrode region (4) of a first conductivity type formed in the first drift-region surface;

a well region (6) of the first conductivity type formed in the second drift-region surface and having a well-region surface;

a second electrode region (8) consisting of first and second adjacent regions (9, 10) of the first and second conductivity type, respectively, formed in the well-region surface;

first and second adjacent regions (15, 16) of the first and second conductivity type, respectively, formed in the well-region surface spaced from the second electrode region (8) and with the first adjacent region (15) being disposed between the second electrode region (8) and the second adjacent region (16);

a floating ohmic contact (14) connecting the first and second adjacent regions (15, 16);

a further well region (20), of the second conductivity type, in a portion of the well-region surface between the second electrode region (8) and the first and second adjacent regions (15, 16) under the floating ohmic contact (14);

a first gate (12) at the second drift-region surface, commencing at the second adjacent region (16) and extending over a portion of the well region (6) of the first conductivity type between the floating ohmic contact (14) and the drift region (3); and a second gate (13) at the second drift-region surface and extending over the further well region (20) of the second conductivity type between the second electrode region (8) and the first adjacent region (15).

19. The thyristor according to claim 14 or 18, further comprising a buffer region (5) of the second conductivity type over the first electrode region (4).

* * * * *